United States Patent [19]

Plesko

[11] Patent Number: 5,550,367
[45] Date of Patent: Aug. 27, 1996

[54] SYSTEM FOR EXTENDING THE OPERATING RANGE OF A BEAM SCANNER

[75] Inventor: George A. Plesko, Media, Pa.

[73] Assignee: GAP Technologies, Inc., Media, Pa.

[21] Appl. No.: 229,728

[22] Filed: Apr. 19, 1994

Related U.S. Application Data

[63] Continuation-in-part of Ser. No. 776,663, Oct. 15, 1991, Pat. No. 5,371,347.
[51] Int. Cl.$^6$ ........................................................ G06K 7/10
[52] U.S. Cl. ............................. 235/472; 235/455; 235/462
[58] Field of Search ..................................... 235/455, 467, 235/472; 359/615, 558

[56] References Cited

U.S. PATENT DOCUMENTS

| | | | |
|---|---|---|---|
| 3,860,794 | 1/1975 | Knockeart | 235/455 |
| 4,575,625 | 3/1986 | Knowles | 235/467 |
| 4,639,589 | 1/1987 | Weber et al. | 250/203.6 |
| 4,818,886 | 4/1989 | Drucker | 235/462 |
| 4,871,904 | 10/1989 | Metlitsky et al. | 235/467 |
| 4,877,949 | 10/1989 | Danielson | 235/462 |
| 4,958,064 | 9/1990 | Kirkpatrick | 235/384 |
| 4,983,817 | 1/1991 | Dolash | 235/462 |
| 4,999,491 | 3/1991 | Semler et al. | 250/236 |
| 5,059,779 | 10/1991 | Krichever et al. | 235/467 |
| 5,140,141 | 8/1992 | Inagaki et al. | 235/462 |
| 5,144,120 | 9/1992 | Krichever et al. | 235/472 |
| 5,149,949 | 9/1992 | Wike, Jr. | 235/467 |
| 5,168,149 | 12/1992 | Dvorkis et al. | 235/472 |
| 5,170,277 | 12/1992 | Bard et al. | 359/210 |
| 5,187,612 | 2/1993 | Plesko | 359/896 |
| 5,438,187 | 8/1995 | Reddersen | 235/462 |

FOREIGN PATENT DOCUMENTS 63-263585  10/1988  Japan .

Primary Examiner—Donald T. Hajec
Assistant Examiner—Karl D. Frech
Attorney, Agent, or Firm—Reed Smith Shaw & McClay

[57] ABSTRACT

Non-Imaging beam conditioning optical elements are disclosed which allow nearly full power usage from a light source, in a beam scanning information readout device such as a bar code reader. Light which would have been otherwise wasted by using stop apertures as in prior art scanning devices, is utilized efficiently by apportioning a greater amount of the light to the far out targets and less to the close in targets, effectively solving the problem of signal amplitude variation over a long working range. At the same time the novel optical elements provide multiple focal ranges which may be made to overlap thereby providing small beam cross sections for near and distant targets, significantly extending the depth of scanning range over prior art scanners. Amplification and signal processing of received light signals is simplified thereby eliminating the need for complex and fussy AGC amplifiers and limiters to deal with both strong and weak signals from close and distant targets respectively. Novel signal processing circuitry is also disclosed for adaptively processing received signals and for reducing variation associated with laser diodes, optical elements, and target related variables such as such as distance, reflectivity and contrast.

50 Claims, 12 Drawing Sheets

SYSTEM FOR EXTENDING THE OPERATING RANGE OF A BEAM SCANNER

This is a continuation-in-part of U.S. patent application Ser. No. 07/776,663, now U.S. Pat. No. 5,371,347 entitled "Electro-Optical Scanning System With Gyrating Scan Head", filed Oct. 15, 1991.

BACK GROUND OF THE INVENTION

In a laser beam scanner a small spot of light is directed toward a target and is swept rapidly across the target. After reflection from the target a photo electric converter such as a photo diode detects the reflected light and converts it to electronic signals representing features of the target. To successfully resolve features of the target it is necessary that the spot size be about the size of, or smaller than, the smallest features of the target.

A bar code reader is an important commercial application for beam scanners and is referred to herein as a typical example of a specific application for the present invention.

In typical barcode scanners imaging optical components such as converging lenses and stop apertures are placed in front of a light source such as a laser diode causing the beam to converge to a small spot about several inches away from the source. The densest bar codes, i.e. those with the narrowest bars and spaces are resolvable where the beam spot has the smallest cross sectional dimensions. This narrow region is sometimes referred to as the beam waist.

In normal practice the range of distance over which the most dense codes may be resolved with a fixed focusing lens is quite short. For example bar code targets with 5 mil, (0.005 inch), wide bars and spaces may only be resolvable over a range of 1 or 2 inches when the waist is located at about 6 inches from the laser source. Such readers are perceived to have a sensitive "sweet spot" when attempting to read dense codes.

Beyond the beam waist where the beam diverges it is only possible to resolve wider bars and spaces. Thus 10 mil bars and spaces can be resolved farther out and over a somewhat greater range than 5 mil ones. Likewise 20 mil wide bars and spaces can be resolved over a greater range than those having 10 mil widths however it is very desirable for portable equipment to have a longer depth of operating field for the dense 5 and 7 mil bar codes.

In the U.S. patent application entitled "ELECTRO-OPTICAL SCANNING SYSTEM WITH GYRATING SCAN HEAD", Ser. No. 07/776,663 of which the present invention is a continuation-in-part, several methods were described for extending the depth of field of a beam scanning bar code reader. One of these methods employ the use of a moving lens system and another employs a non-imaging cone shaped optical element to provide a beam which is narrow over a certain distance and diverges rapidly beyond that distance.

U.S. Pat. No. 4,816,660 describes the use of a conventional aperture stop to increase depth of field of a laser bar code reader. The aperture stop has a draw back in that it wastes or "throws away" a substantial portion of the laser beam power to gain increased depth of field.

Besides the depth of field problems associated with beam spot size, the detection of reflected light signals from both close and distant targets presents a problem regarding signal strength which is also perceived as a working distance limitation for scanning equipment. In a bar code reader when light is scanned across a target it is diffusely reflected over a large solid angle and only a small portion of the reflected light is received by its light detector. Since the amount of light received from a target close to the scanner is much greater than that received from a more distant target, the signals produced by the photo detector are strong for the close targets and weak for the distant ones. In either case however, the signals must be detected, amplified, shaped, and digitized.

To detect the weak light signals from the far out targets, the signals from the photo detector must be amplified and the outgoing beam must be strong enough to provide an ample signal to noise ratio for error free information processing. Alternatively, if the target is close, to the scanner the light returned from the target can be so strong that it results in saturation of the signal amplifiers. In addition, strong optical noise is received from the surface of the close target itself due to its natural surface texture and the surface noise signals can be so strong that they falsely trigger pulse shaping circuits to give the perception to a user that the apparatus lacks depth of field.

In order to overcome the signal processing difficulties manifested as undesirable wide dynamic range of the returned signal amplitude associated with both strong and weak optical signals as well as target noise; automatic gain control (AGC) amplifiers are usually employed to supply a somewhat constant amplitude signal to conventional comparator circuits. Such AGC circuits are notoriously difficult to design and optimize. Limiter circuits may also be added to prevent amplifier saturation but they tend to degrade signal to noise ratio.

U.S. Pat. No. 5,130,520 describes how a defocused Fresnel lens placed in front of a photo diode can help ameliorate the problems associated with variation in the amplitude of light signals for close in and far out targets but this requires significant spacing between the Fresnel lens and photo diode and adds to the bulk of the system. The same U.S. patent also describes the use of louvers to deal with the problem of signal amplitude variation but these also lead to bulky layout and spacing requirements unsuitable for compact designs.

SUMMARY OF THE INVENTION

The present invention employs novel non-imaging beam conditioning optical elements which allow nearly full power usage from a light source in a beam scanning information readout device such as a bar code reader. At the same time the novel optical elements disclosed herein provide multiple focal ranges which may be made to overlap thereby significantly extending the depth of scanning range over prior art scanners.

Besides the improvement obtained by utilizing light which would have been otherwise wasted in the prior art scanning devices, the present invention uses this light by apportioning a greater amount of the light to the far out targets and less to the close in targets. Thus the present invention effectively solves the problem of diminishing signal amplitude over a long working range while providing a small spot size to extend optical field depth. Amplification of light signals is therefore much more straight foreword, requiring simpler electronic signal conditioning circuits thereby eliminating the need for complex and fussy AGC amplifiers and limiters to deal with both strong and weak signals from close and distant targets respectively.

Novel signal processing circuitry is also disclosed for adaptively processing received signals and for reducing variation associated with laser diodes, optical elements, and target related variables such as distance, reflectivity and contrast.

BRIEF DESCRIPTION OF THE DRAWINGS

FIG. 8c shows a multi-zone element with three areas for light to pass through.

DESCRIPTION OF PREFERRED EMBODIMENTS

While the following description may refer to a bar code reader and the items being read as bar code targets, it should be understood that the invention is applicable to other information readout devices and equipment requiring beam conditioning as disclosed herein. Accordingly, as used herein, the term target refers not only to a bar code but to any item having optically discernible features which require detection and discrimination and optical signal may repre- sent any electronic or optical signal of unpredictable amplitude.

Figure 1:
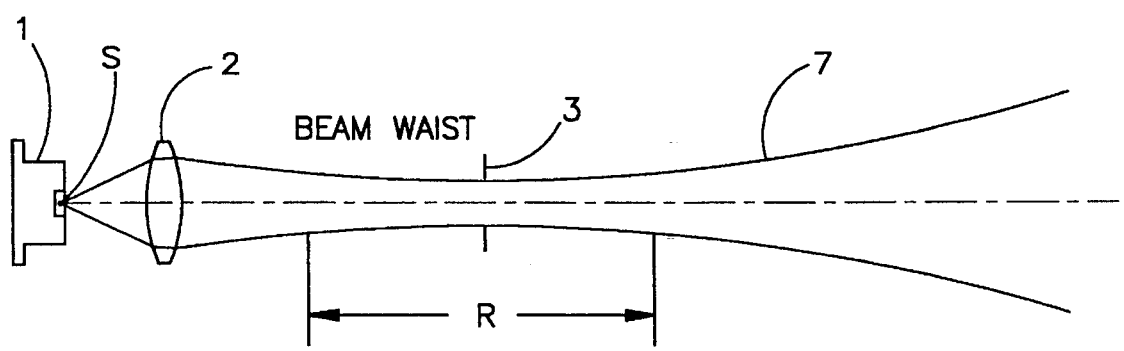
FIG. 1 shows how a converging lens creates a narrow waist region in the beam from a laser light source.

As shown in FIG. 1 a light source such as a semiconductor laser 1 produces a light beam emanating from source S, which is focused by a positive converging lens 2.

The light from source S converges down range to an area known as the beam waist 3 which is the area of greatest power concentration or intensity of the beam. In the waist region the light beam has its smallest cross section. Thus in the vicinity of the beam waist the highest resolution is obtainable and the finest target detail is resolvable. In practice the beam is shaped to converge and diverge gradually as depicted by beam profile curve 7 so as to produce a useful range R of field depth for bar code reading.

Figure 2:
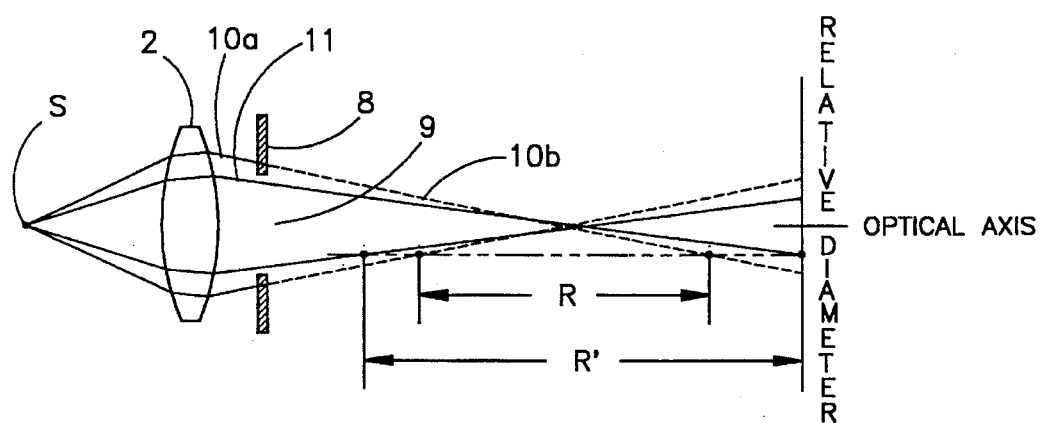
FIG. 2 shows how an aperture stop is used to make a beam cross section smaller while sacrificing beam power to extend the depth of field.

If an aperture and stop is placed in front of the converging lens as shown in FIG. 2, the widely diverging portion of the beam typified by ray 10a is blocked by stop 8, whereas a less divergent portion of the beam as shown by ray 11 passes through aperture 9. The result is that ray 11 moves down range unimpeded whereas Ray 10a which would have followed dotted path 10b is blocked.

If the aperture stop were not used as in FIG. 1, then the useful range where the beam size would be small enough to resolve a bar code target is depicted by range R. Due to the aperture stop the range where the spot size is useful will be relatively longer as indicated by R' however, light is wasted. This of course is in accord with well known principles of geometric optics, Gaussian beam geometry and stop aperture techniques.

Figure 3:
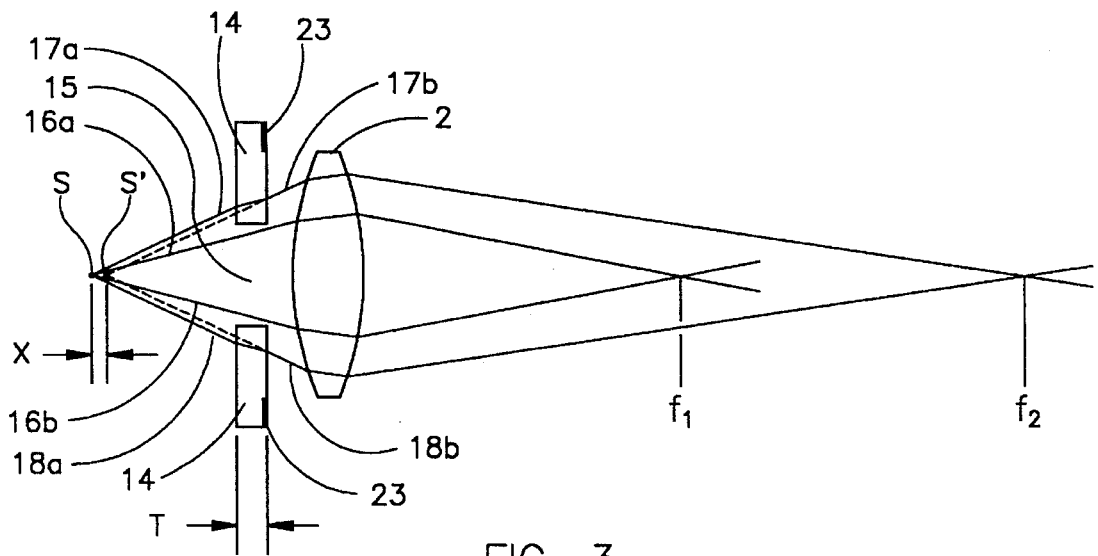
FIG. 3 shows an embodiment of the present invention and how it creates an extended depth of field without sacrificing beam power.

Now turning to FIG. 3 we see a transparent window 14 having an aperture 15 in it. The transparent window has a thickness T and an index of refraction N>1. This transparent aperture window is located between real light source S and converging lens 2.

Rays emitted from source S such as ray 16a and 16b which diverge at angles small enough to pass through aperture 15, will focus at f1 after passing through positive lens 2.

On the other hand rays such as 17a and 18a also emitted from source S which diverge at an angle too large to pass through aperture 15 will pass through the window 14 and undergo refraction. These more divergent rays emerge along paths typified by rays 17b and 18b respectively. After passing through converging lens 2, rays such as 17b and 18b then converge in the vicinity of f2 farther down range in accord with the principles of geometric optics. Accordingly, if a laser light source is used the beam will form two waist regions characteristic of Gaussian beams. Because of refraction, the light which passes through the refractive window 14 such as original rays 17a and 18a behave as if they had originated at two different source points, one being a virtual source point S' which is closer to converging lens 2 than is real source point S.

The distance X between source points S and S' in air is equal to (N−1)T/N, where N is the index of refraction of the refractive window material and T is its thickness. This along with the well known formulas for image position can be used to design similar window elements with focal ranges as desired.

It should be remarked here that the virtual source S' location is different from the real source S location because as portions of the beam pass through media with different indices of refraction, different optical path lengths are created. Any number of optical paths may be created in this manner and when rays from the various paths are passed through a converging optical element such as a positive lens the rays from the different sources will converge at different points down range. Since this system has no single focal length it is inherently a non-imaging beam conditioning device.

In a preferred embodiment as shown in FIG. 3 the aperture 15 is made small so that only a small fraction of the light passes through it for the close in targets and a substantially greater amount of light is allowed through the window part of the transparent substrate 14 for focusing upon distant targets.

Since the proportion of light returned from distant targets will be far less than the proportion returned from the close targets, more light is allocated to the distant ones and focused down range. The smaller portion of light which is focused on close targets is easily detected up close but is out of focus for the distant ones and has an insignificant effect upon the light signal detector for these.

Alternatively, the light allocated for the distant targets is not yet in focus to resolve close targets and hence does not produce well modulated pulses when it sweeps across the close targets but produces sharp pulses when swept across distant ones and is thereby detected. In this way the dynamic range problem of varying light intensity over large distances is solved while small spot size is provided up close as well as down range.

Digitization of the sharp high speed electronic pulses, produced with multi-zone beam shaping elements is accomplished with special circuits designed to be responsive to abrupt variations in reflected light signals produced by light swept across a target. The use of differentiator circuits and electronic filters are also employed to accomplish the required signal discrimination.

Figure 4:
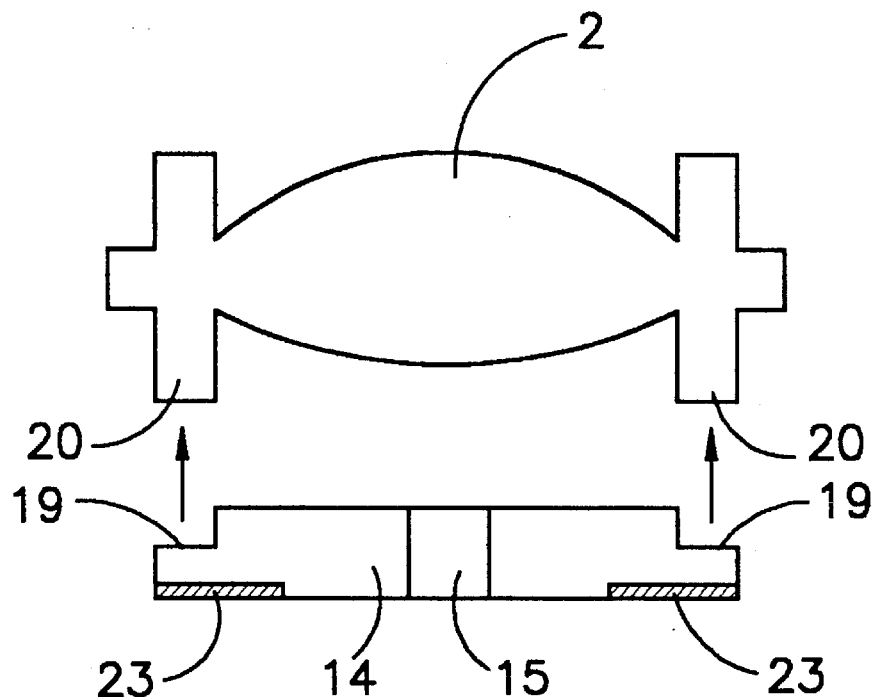
FIG. 4 shows another embodiment of the present invention with a mounting means.

While it is highly desirable to not waste light from the source, it is well known that the angle of divergence of light from laser diode light sources can vary by several degrees from one unit to another. In order to obtain consistent results and predictable behavior from diode to diode it is desirable to eliminate light which diverges from the source at an angle greater than an allowable maximum. This may be accomplished by adding an annular area 23 as seen in FIG. 4 to preclude the unwanted excessively divergent light from reaching the target.

Figure 15:
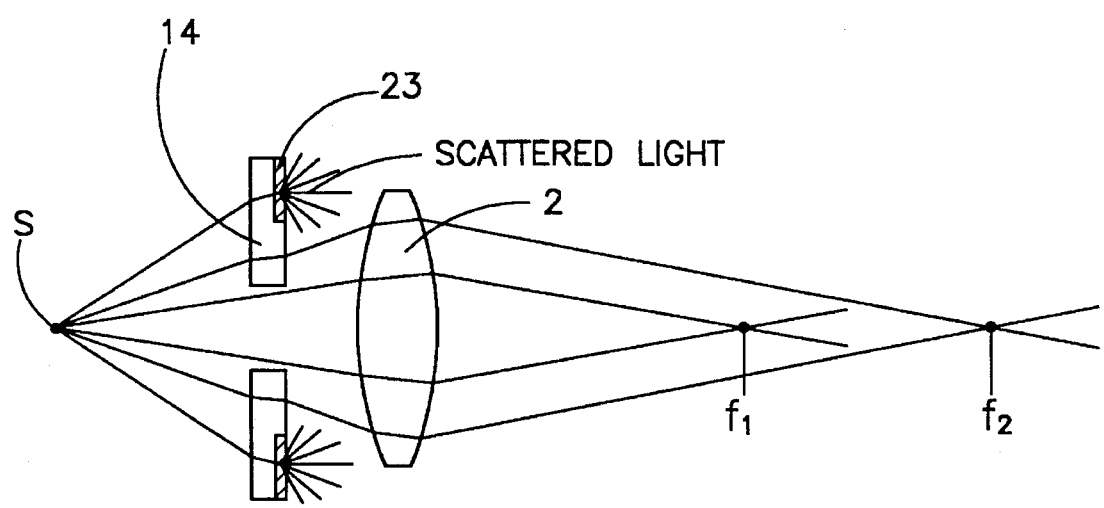
FIG. 15 shows an embodiment of the present invention wherein unwanted light is scattered by a translucent area in an optic means.

In a preferred embodiment (shown in FIG. 15) annular area 23 is simply given a frosty or translucent finish for scattering unwanted light but it may, of course, be made opaque to block the unwanted light.

The transparent aperture window 14 may be made from glass or plastic film with the hole etched or drilled and the light scattering area 23 frosted. Odd shaped apertures and other features may be etched into glass windows using hydrofluoric acid and photo-lithographic techniques. In order to center and mount the window an etched shoulder 19 may be provided to center it on a lens having a rim 20. Such lenses are available in molded plastic from Universe Kogaku (America.), Inc. and are used in CD players. They are available with focal lengths of 3.3, 4.5, and 3.9 mm. A suitable thickness for the transparent aperture window has been found to be from 0.004 to about 0.008 inches and was originally fabricated from thin glass. The window was mounted between a laser diode and a lens having a 3.9 mm. focal length.

This combination can be focused so a first beam waist occurs at about 10 inches away from the light source and a second at about 18 inches away with excellent resolution near in and far out. Other combinations are easily arranged as dictated by performance requirements and the design formulas previously cited.

Hole sizes on the order of 0.040 inch to 0.025 inch diameter are easily fabricated commercially and would be well suited for this system to allocate adequate light far out. Not much light is needed or desired for close targets.

FIGS. 8a, 8b 8c and 8d show other window element configurations having a slot shaped opening, 50 an ellipse shaped opening, 72 a solid bar of refractive material 74 and a semi-circular openings 76. Each of these elements can produce useful multi-focal beam properties according to the present invention.

Figure 5:
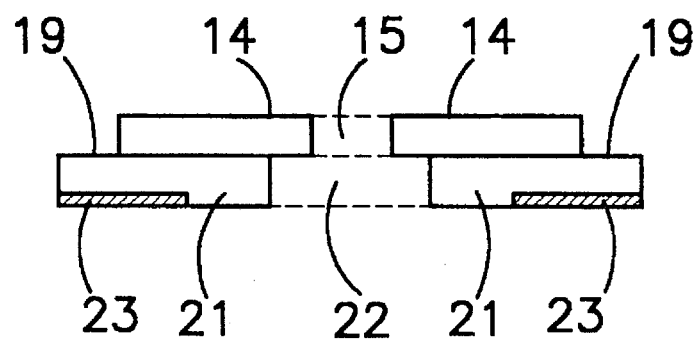
FIG. 5 shows a more sophisticated embodiment of the present invention for producing three focal ranges which may be designed to overlap.

The concept of dual zone focusing as explained above for the two zone embodiment may be extended to many zone focusing. In FIG. 5 a second transparent refractive step 21 is added to the transparent refractive window 14 to create three distinct optical path lengths through the device: (1) straight through clear aperture 15, (2) through clear aperture 22, then through refractive window 14, (3) through refractive layer 21, then through refractive window 14. Light traversing these three distinctly different paths followed by a positive lens will converge at three distinctly different zones down range in the manner previously explained for dual zone focusing.

When a laser light source with a Gaussian beam output is used with the multi-zone elements as described herein, the light does not focus to distinct points. Instead, each distinct optical path creates multiple beam waist regions or "focal ranges" down axis. If these waist regions are spaced appropriately they can be made to create overlapping focal zones thus providing a beam which is narrow over a certain distance range and which diverges beyond the last focal zone in accord with concepts elaborated upon in U.S. patent application Ser. No. 07/776,663 of which the present application is a continuation-in-part.

Figure 6A:
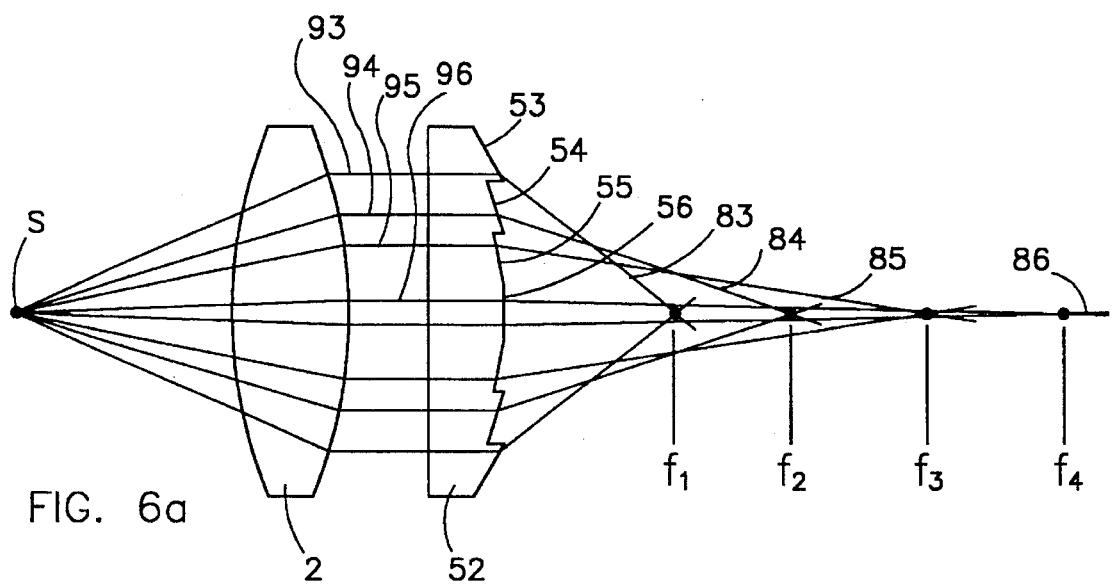
FIG. 6a shows a non-imaging multi-zone optical element placed after a converging lens for producing many focal zones.
Figure 13:
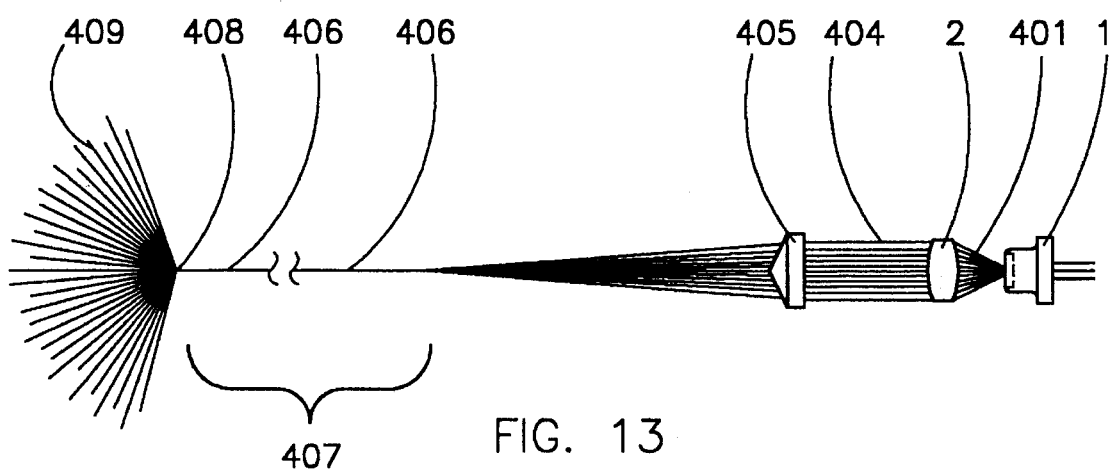
FIG. 13 shows a light source, collimating lens and a cone shaped non-imaging optical element generating a long focal range.
Figure 14:
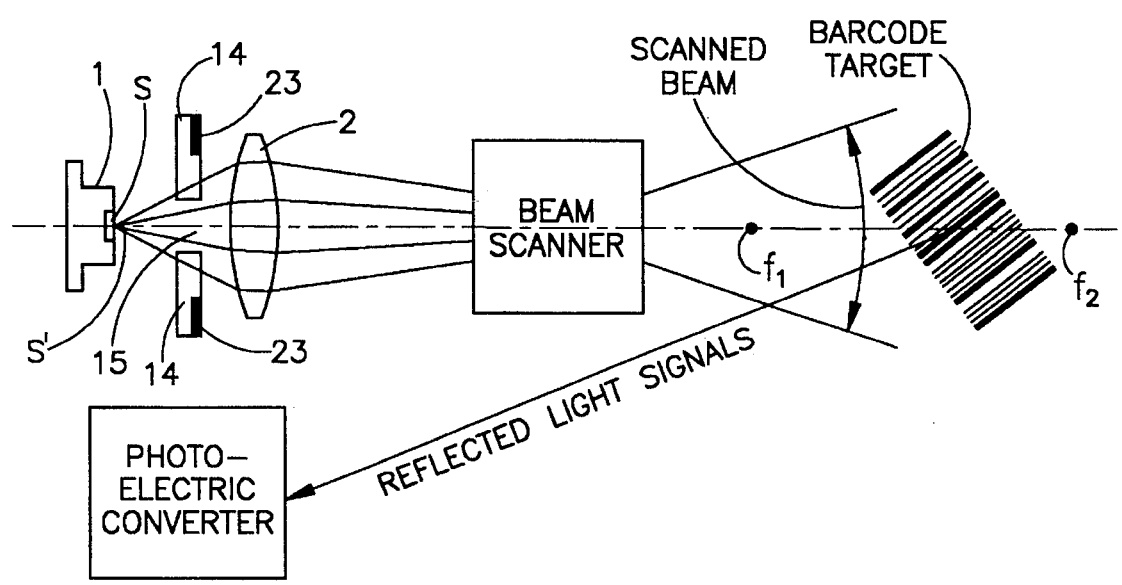
FIG. 14 shows a two zone element of the present invention for use in a bar code target scanner.

In FIG. 6a a multi-zone, non-imaging, optical element 52, according to the present invention is illustrated which will yield four separate focal ranges f1, f2, f3, and f4 when inserted after a focusing lens. (In this case element 52 does not produce multiple virtual sources as do elements in previous examples.) It should be remarked here that although optical element 52 may look like a Fresnel lens due to its concentric zones 53, 54, 55, and 56 but it is not a Fresnel lens. Unlike a traditional Fresnel lens, it is not an imaging type optical element because it does not posses any particular focal length since concentric zones 53, 54, 55, 56 cause rays 93, 94, 95, 96 to converge as rays 83, 84, 85, 86 at different foci f1, f2, f3 and f4, respectively. The angle of each concentric zone may be made to decrease or increase, as shown in FIG. 6a, from the center outwardly as dictated by design requirements, the principles of geometric optics and gaussian optics if a laser source is used. If the angles of the concentric zones are designed to decrease from the center outwardly, then the order of the focal ranges as seen in FIG. 6a may be reversed so that the outermost concentric zones cause light to focus at the more distant ranges. Instead of several discrete zones shown on element 52 of FIG. 6a, FIG. 13 shows an element 405 which generates a continuously narrow beam 406. In the system of FIG. 13, a light source 1 generates a beam 401 which is collimated by lens 2 to form collimated beam 404 after which it is converged by cone-shaped non-imaging optical element 405 to generate a continuously narrow beam 406 which remains converged along length 407, then rapidly diverges at point 408 finally dispersing in area 409.

Figure 6B:
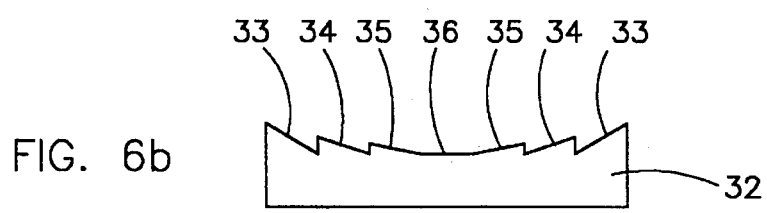
FIG. 6b shows another non-imaging multi-zone optical element for producing many focal zones.

In FIG. 6b, an element 32 is shown having concentric zones 33, 34, 35, and 36, which may be placed between a real source and a converging lens. Light emitted from the real source will appear to emanate from multiple virtual sources, and after passing through an appropriate lens will converge at multiple focal distances down range. The angled zones can be designed to have a kind of positive or negative optical power so that such elements may be placed in front of a converging lens and each zone will cause light to converge at a different place down range. These zones can also be sized to apportion the desired amount of light to successive focal zones.

In preferred embodiments the circular areas of each step of the multi-zone elements described herein are sized to focus an increasingly greater amount of light on the more distant targets in order to compensate for the signal amplitude variation due to target distance losses as previously described. Typically a good first approximation to this design would be to apply a square law relationship for range versus the proportion of light allotted for the various zones; i.e. as distance from the light detector to a focal zone is doubled the amount of light allotted to the zone is quadrupled.

Figure 7:
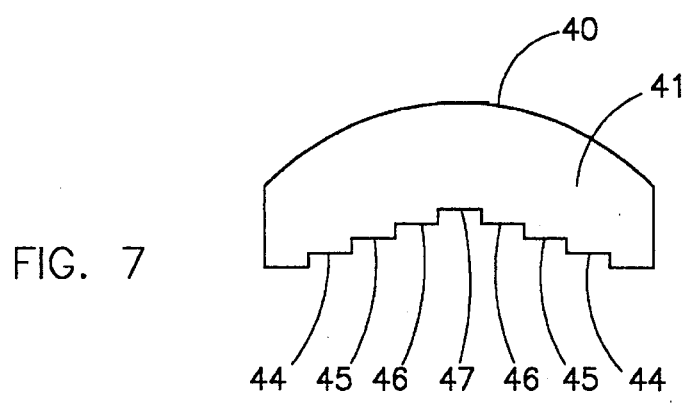
FIG. 7 shows an integrated multi-zone optical element combined with a lens.

A preferred fabrication method is to make the multi-zone element from injection moldable plastic. In yet another embodiment the multi-zone element would have its zonal features molded into a single integrated optical element as illustrated in FIG. 7 with stepped zones 44, 45, 46, and 47 molded into element 41 and a lens surface 40 all combined as a single part. Also the area of each zone may be sized to cause increasing amounts of light to be focused farther down range.

It is also anticipated that the multi-zone element as described herein could be fabricated in mass volume as a holographic optical element (HOE) as was one of the beam shaping elements described in the U.S. patent application of which the present application is a continuation-in-part.

Figure 7B:
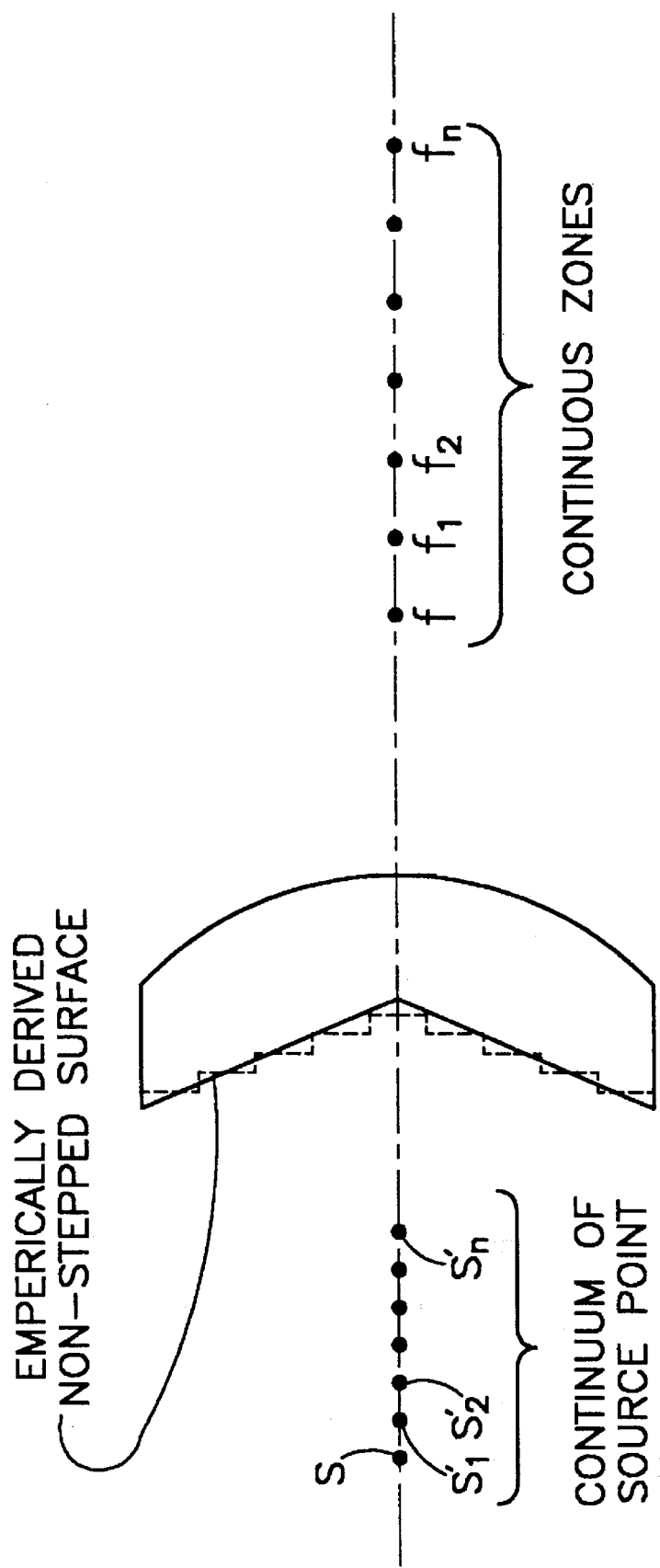
FIG. 7b shows a further integrated optical element combined with a lens in accordance with the present invention.
Figure 8A:
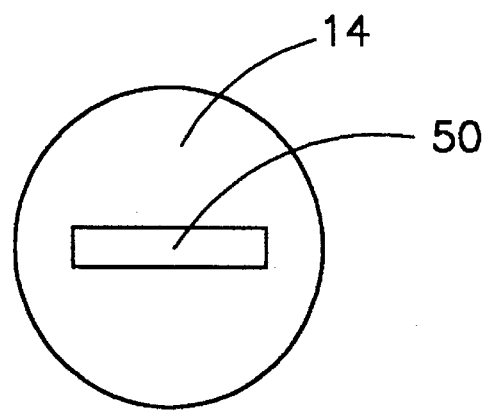
FIG. 8a shows a two zone element with a slot aperture.
Figure 8B:
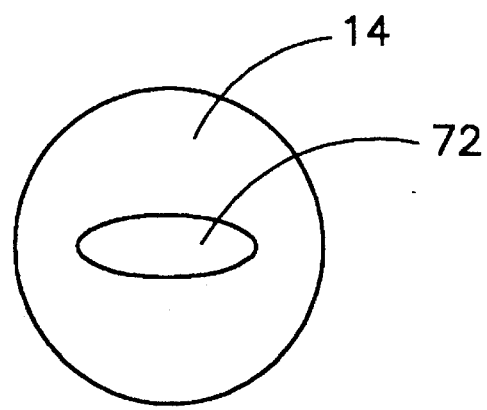
FIG. 8b shows a two zone element with an elliptical aperture.
Figure 8C:
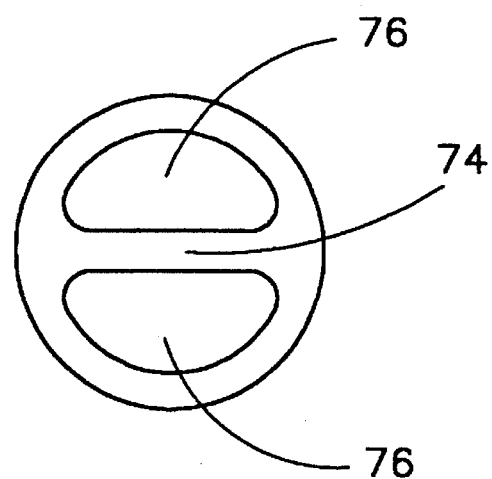
Figure 8D:
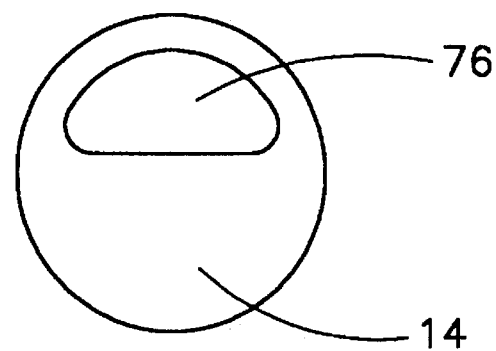
FIG. 8d shows another two zone element.

As shown in FIG. 7b, the multi-zone, range extending, optical element of the present invention can be designed with a specially contoured non-stepped surface shape to effect continuous extended zone focusing and beam power characteristics down range. In order to generate the required characteristic surface curvature, the element is first designed with many discrete zones. Then using standard mathematical curve fitting techniques the equation of curvature is empirically derived. Numerically programmed diamond machining techniques are then applied to produce the required mold cavities.

Figure 9:
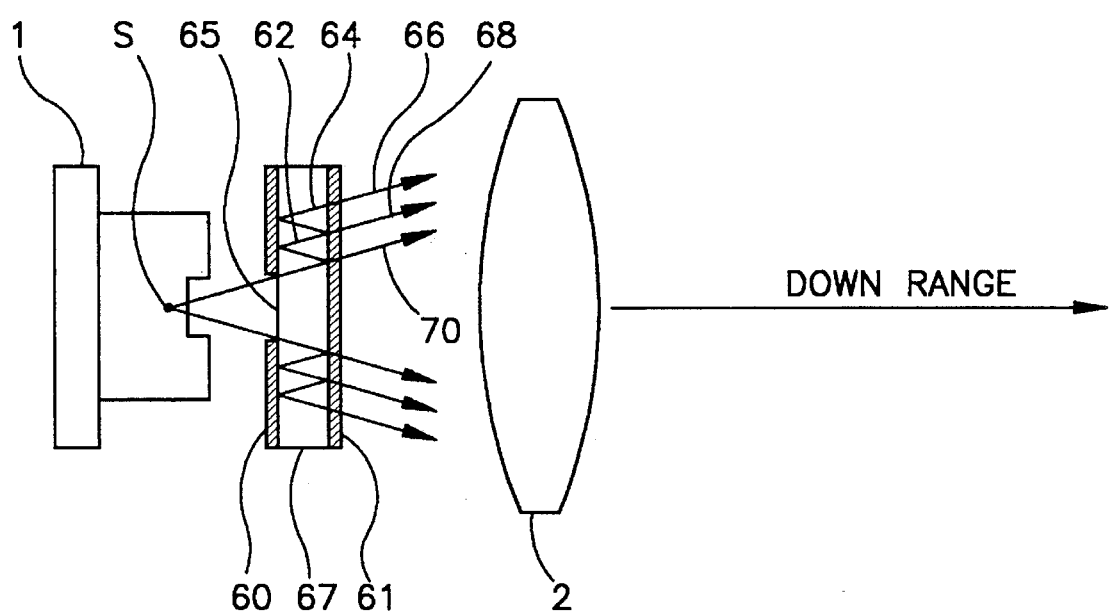
FIG. 9 shows an optical element using dual reflectors for producing multiple virtual light sources and multiple focal ranges.

Another embodiment of the present invention is shown in FIG. 9 wherein transparent substrate 67 has mirrored surfaces 60 and 61 and is located between primary light source S and positive lens 2. A small aperture 65 is provided in reflective surface 60 to allow light from source S to pass through. On the opposite side of substrate 67 is a partially reflective, partially transmissive surface 61. As light rays from source S pass through aperture 65 a portion of them such as rays 62 and 64 will continue through partially reflective coating 61 as typified by rays 66, 68 and 70 proceed through converging element 2, whereupon they converge down range. A substantial portion of the light from source S encountering partial mirror 61 will, however, be reflected back from surface 61 toward surface 60 then again toward surface 61 as typified by ray 62. If the path of ray 62 is traced back toward source S it will seem to come from a virtual source different than S. Thus rays such as 62, after passing through lens 2, will converge down range at a different place than non-reflected rays and the multiple reflections set up between the two mirror surfaces 60 and 61 will give rise to multiple virtual sources and the desired multiple focal ranges.

SIGNAL PROCESSING CIRCUITS FOR USE WITH THE OPTICAL ELEMENTS

Not only are the beam characteristics such as focal lengths and power distribution important in determining the overall useful operating range of a beam scanner but so is the signal processing circuitry. As previously pointed out the strength of the returned light signal and its noise content must be considered when processing the information signal into a computer readable form. The various embodiments of the optical element previously described address the proportion of light allotted to close and distant targets as well as spot size and range but other factors also need consideration. For example, overall light output of the light source proportionately affects the amount of light received by the light detector. This can vary with operating conditions such as temperature and age of the light source. Also target properties such as surface texture, color, and reflectivity can have a major influence on the amount of light returned to the photo detector. To a user these factors will affect the perceived goodness of depth of operating range. To effectively deal with these effects an adaptive trigger circuit has been invented and is now described.

ADAPTIVE TRIGGER CIRCUITRY

Figure 11:
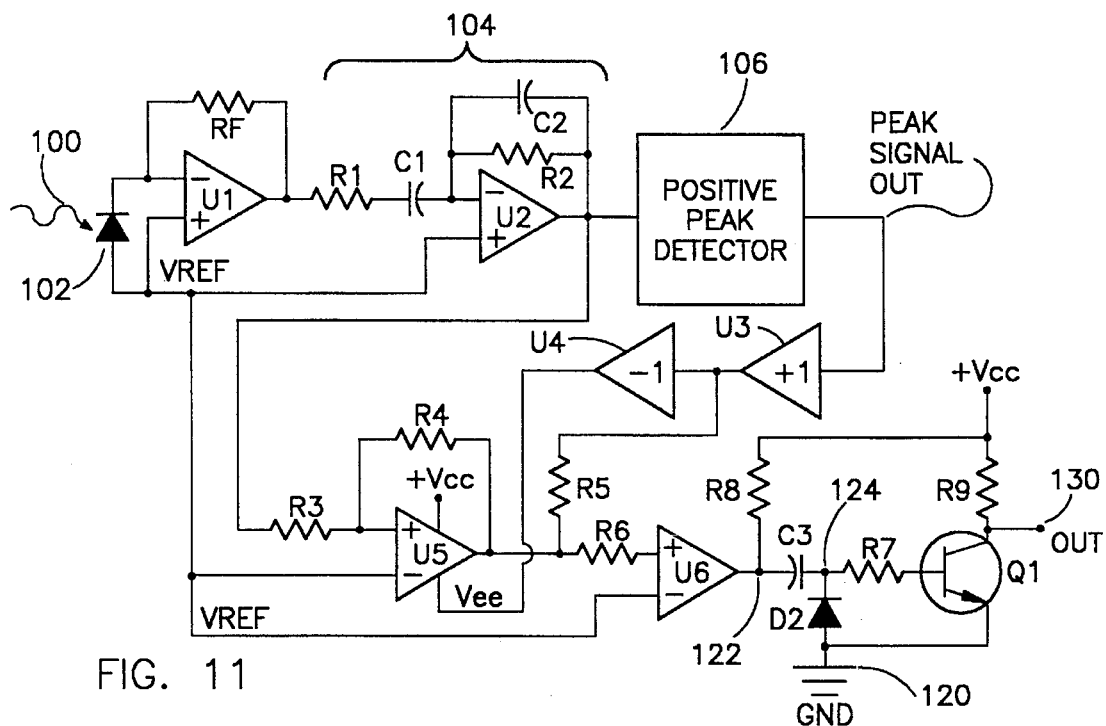
FIG. 11 shows a schematic diagram of a novel adaptive hysteresis circuit for digitizing signals.

The novel adaptive circuit may be understood by turning to the schematic diagram shown in FIG. 11. As light signals 100 from a target enter photo detection diode 102 they are converted by amplifier U1 into analog signals representative of target features which are passed to differentiator circuit 104 comprised of R1,C1,R2,C2,U2 the output of which is made primarily responsive only to high speed abrupt changes in the signal resulting from scanning focused light across a target and not to unwanted low frequency signals. In a bar code reading application these abrupt changes correspond to movement of the light beam as it makes a transition from a bar to a space or vice versa. It is desired to convert the differentiated waveform into square wave pulses of constant height having widths proportional to the time taken for the scanning spot to pass the bars and spaces of the code in order to decode them.

Figure 10:
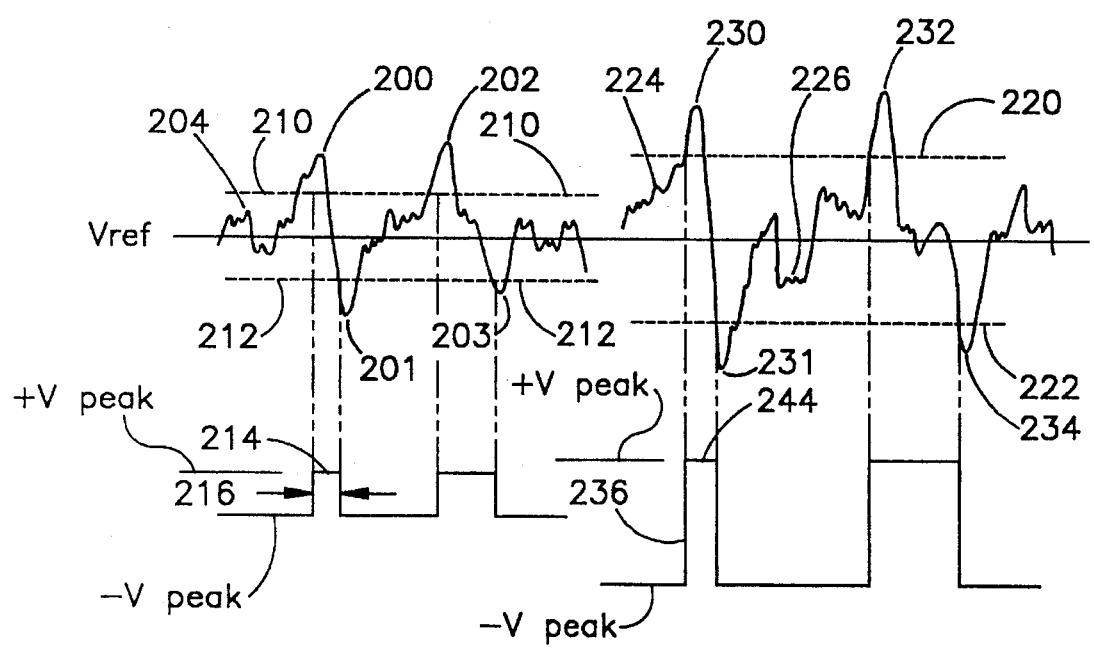
FIG. 10 shows signal diagram of how trigger thresholds are set to produce digital signals.

FIG. 10 illustrates the signal processing required for two differentiated waveforms of differing signal amplitudes and noise levels. Typical information signal peaks such as 200, 201 and 230, 231 swing above and below a common reference voltage, Vref. The shorter peaks 200 and 201 may come from a distant or poorly reflective target and are accompanied by background noise peaks 204, 205 while strong peaks 230, 231 may come from a close target and are accompanied by proportionately stronger target noise peaks 224, 226. In order to square up weaker signals 200, 201 a comparator circuit with hysteresis may be employed which is set to trigger ON above the maximum noise peak 204 when the signal amplitude reaches trigger threshold 210 indicated by a dashed line and OFF when the signal waveform drops to a low threshold level 212 below noise peak 205. In this way a corresponding square wave 214 may be generated which has a time width 216 approximately proportional to a bar or space as the case may be. Unfortunately if the signal were a strong signal such as that represented by peaks 230 and 231, the corresponding noise level peaking at points 224 and 226 would falsely trigger the comparator at preset trigger levels 210 and 212.

For the stronger signals it is necessary to trigger ON and OFF at different levels 220 and 222 to prevent false noise triggering and to generate square pulses such as 236 with amplitude 244. These different levels however would fail to trigger on the weak signals 200, 201 produced by distant targets. One would want to set the trigger levels automatically so they are appropriate what ever the signal amplitudes are while avoiding false triggering by the noise. The adaptive trigger circuit of FIG. 11 has therefore been invented to do just this.

The differentiated waveform output of U2 is fed into a high speed positive peak detector 106 which outputs a DC voltage equal to the peak differentiated signal amplitude received from a target. In a bar code scanner this peak level need not be sensed instantly but rather may be established after a few scans since many hundreds of scans are normally executed per second in such readers.

The output of peak detector 106 is buffered by amplifier U3 having a gain of +1 so it may supply DC current at the positive peak differentiated signal voltage without disrupting the output of U3. The positive peak voltage is also fed to a (−1) inverting buffer U4 which outputs a voltage approximately equal to the most negative swinging differentiated signal amplitude with respect to Vref. Vref is typically chosen to be ½ the voltage of supply voltage +Vcc with respect to supply ground 120.

Circuit element U5 is a high speed CMOS comparator. Texas Instruments, Inc. makes these comparators with two units in one package. One such model, TLC352C, can operate with a single ended supply voltage as low as +1.4 volts, and since it has an open drain CMOS transistor output it can switch its output clear down to its negative supply rail Vee. (Comparators with open collector bipolar transistor outputs can not do this.) In the circuit of FIG. 9 the supply voltage +Vcc is typically about +5 volts.

Notice that the output of inverting amplifier U4 which represents a negative signal level with respect to Vref may be small or large and is connected to the negative power supply pin of U5 to supply a negative power supply voltage to U5 having a value approximately equal to the most negative signal pulse received by peak detector 106. Thus this voltage is a variable pseudo-supply ground for U5. (It is not common to bias a comparator with a negative peak signal voltage level used as a pseudo-supply ground.) Normally the negative power supply pin of a comparator is connected to supply ground and may not be quickly responsive to changes in a non-fixed ground level such as the pseudo-supply ground used here, but in this case it need not respond very quickly since it will have numerous scans over which to stabilize. Notice also that even if the negative supply voltage of U5 were to equal Vref when no signal is received, the comparator will operate because +Vcc (at about +5 volts) is enough above Vref (at +3 volts) to power the comparator which operates with only a +1.4 volt supply.

Since the output of U5 can switch down to its negative supply rail its output will drop to −V peak when its output is in the OFF state. The open drain output of U5 is connected through pull up resistor R5 to +V peak which represents the maximum positive excursion of the differentiated signal amplitude supplied by the output of positive peak detector buffer amplifier U3. If comparator U5 is triggered ON its output will swing to the peak positive value of the received differentiated signal. Thus comparator U5's output will go to the value of the positive peak signal supplied by U2 when ON and to the negative peak value of this signal voltage when OFF. The negative input of U5 is connected to Vref and U5 is also provided with a hysteresis trigger circuit at its positive input established by resistors R3 and R4. This hysteresis trigger arrangement will cause the upper and lower trigger thresholds of U5 to be equally placed above and below Vref. Furthermore, unlike prior art trigger circuits with fixed trigger thresholds, U5 will now turn ON when the signal voltage reaches a value (+V peak)(R3/R4) and OFF when the signal voltage falls to (−V peak)(R3/R4) where +V peak and −V peak are the maximum and minimum values of the signal levels respectively.

For the self adjusting trigger circuit of FIG. 11 it has been found that a ratio of about 0.7 for R3/R4 is well suited to avoid noise levels in bar code reading applications. Thus the circuit triggers adaptively always at +/−70% of the differentiated signal peaks no matter what amplitude the signal peaks may have.

The output of U5 will now produce very clean square wave transitions symmetrically above and below Vref representative of the widths of bars and spaces, however the output amplitude of U5 is equal to the peak to peak amplitude of the differentiated signal which may vary from only a few tens of milivolts to a few volts. Such a signal is not yet suited for logic level signal processing. It must be made to swing from supply ground up to a minimum value required by digital switching circuitry.

To achieve the final signal form needed, the output of U5 is fed directly into the positive input of a second comparator U6 which can also be a CMOS comparator but it may be a common bipolar type. Since comparator U5 is supplied in packages containing two such units it is preferred that U6 be the second CMOS comparator packaged with U5.

The negative input of comparator U6 is again referenced to Vref, but its positive input needs little or no hysteresis since the signal supplied to it by U5 is already a clean square wave.

The output of U6 will now follow that of U5 time wise but will be +Vcc (+5 V) when ON and −V peak when OFF regardless of the amplitude of the signal supplied to its input.

Circuit elements C3 and D1 reference the square wave output of U6 appearing at point 122, to supply ground 120. Junction 124 will now switch from supply ground to about ½ (+Vcc). Finally the signal at junction 124 drives high speed switching transistor Q1 through resistor R7 whereupon a clean square wave output appears at output terminal 130 which goes from supply ground to +Vcc in accord with received signals having a wide range of signal amplitudes.

This adaptive hysteresis trigger circuit generates square wave transitions at output 130 required by digital signal processing equipment regardless of incoming signal amplitude. Few parts are needed and the design is robust, requiring only that the ratio R3/R4 be selected. In addition the circuit complements the beam shaping methods described earlier to deliver a high level of performance with respect to depth of range in beam scanning equipment, such as bar code readers, object and edge detection devices and the like. Furthermore it is contemplated that this novel high speed adaptive hysteresis trigger circuit may also be used to shape and condition signals in fiber optic receivers, optical local area network receivers, RF information receiving equipment and other information signal processing equipment.

LIGHT SOURCE CONTROL CIRCUIT

Figure 12:
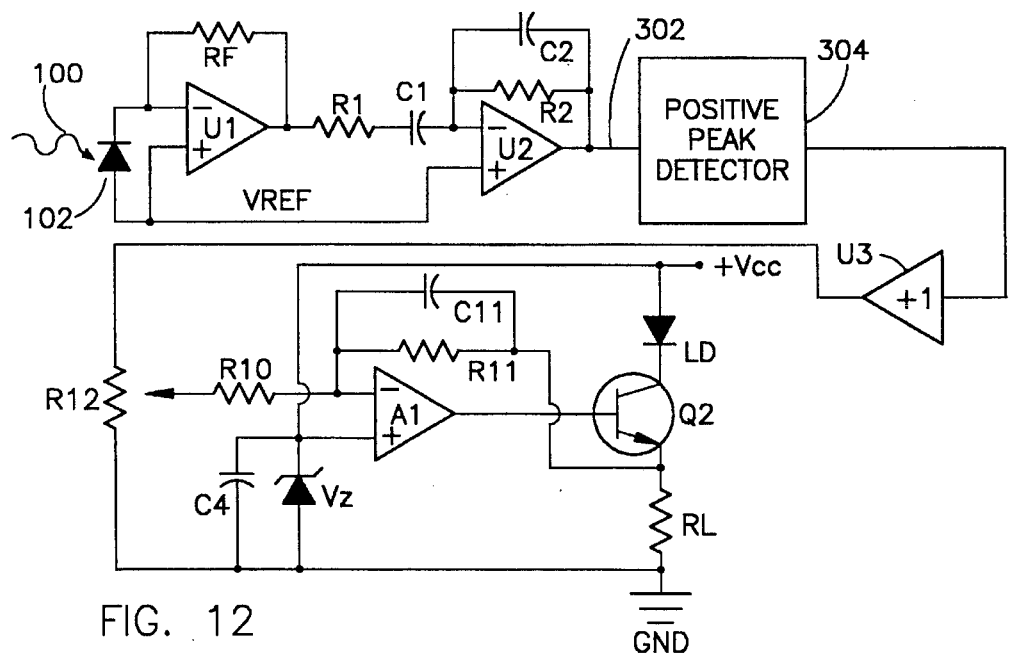
FIG. 12 shows a schematic diagram of a circuit for controlling laser output power as a function of received signal strength.

In certain cases, especially where targets are to be read at close ranges, the full power of a laser diode light source can be so strong that it will generate substantial optical noise when swept across a textured surface. Also the life of laser diodes can be shortened by operating them at high power. The circuit described below solves these problems while providing the higher power output levels when required to read distant targets. In addition to these benefits, the circuit shown in FIG. 12 provides a readily processable signal for both near and far targets.

The amplified photo detector signal such as that derived from the output of the differentiator circuit 104 of FIG. 11 is fed into the input 302 of buffered signal peak detector 304. A proportion of the buffered peak detector output signal is input to the negative input of amplifier A1 through R10. Amplifier A1's output drives the base of transistor Q2 which controls the current supplied to laser diode LD and therefore its light output. If the received signal is too strong transistor Q2 thereby reduces the light output of the laser diode and increases the light level if the received signal is too weak.

Current drawn by laser diode LD is sensed across load resistor RL and a portion of this signal is returned to the negative input of A1 through R11. The value of RL is typically chosen to be a few tens of ohms and R11 and zener reference voltage Vz are chosen to limit the current supplied to laser diode LD to a safe level to prevent damage to it.

The circuit will control the output of the of a laser diode to deliver adequate optical power to the target while maintaining returned signals at conveniently processable levels while extending the service life of the laser.

While particular embodiments of the present invention have been illustrated and described herein, it is not intended to limit the invention and changes may be made therein and still remain within the spirit of the following claims.

What is claimed is:

1. An optical system for distinguishing features of a target in a working distance range comprising:
   a light producing means for generating a first group of light rays and a second group of light rays from a light source position;
   a focus means for converging said first group of light rays and said second group of light rays in said working distance range;
   an optic means disposed between said source and said focus means, said optic means having a thickness that is less fit an a length between first and second ends of said working distance range;
   said optic means having at least first and second optical path regions for simultaneously receiving said first group of light rays and said second group of light rays, respectively, from said source position and for refractively forming, with said focus means, a third group of light rays and a fourth group of light rays, respectively; and
   wherein said third group of light rays converge in said first end of said working distance range and said fourth group of light rays converge in said second end of said working distance range, said second end of said working distance range being downrange from said first end of said working distance range, and wherein said first optical path region is formed of an opening in said optic means.

2. An optical system according to claim 1 wherein, said second optical path region of said optic means consists of a refractive material having an index of refraction greater than one.

3. An optical system according to claim 2 wherein, said optic means has at least one step.

4. An optical system according to claim 3 wherein, said focus means and said optic means are integrally combined as a single element.

5. An optical system according to claim 2 wherein, said optic means is generally flat with at least one opening.

6. An optical system according to claim 5 wherein, said system is adapted for use in a bar code scanner.

7. An optical system according to claim 5 wherein, said opening is a circular opening.

8. An optical system according to claim 7 wherein, a first portion of the light beam generally converges in a first focal range and a second portion of the light beam generally converges in a second focal range farther down range than said first focal range, said first and second focal ranges being within said working distance range.

9. An optical system according to claim 5 wherein, said opening is generally slot shaped.

10. An optical system according to claim 5 wherein, said optic means includes a bar shaped area for light to pass through.

11. An optical system according to claim 1 wherein, said optic means is adapted to apportion a relatively smaller amount of light to a close-in working distance range and a relatively larger amount of light to a far-out working distance range.

12. An optical system according to claim 11 wherein, said system is adapted for use in a bar code scanner.

13. An optical system according to claim 1 which further includes;
   a scanning means for scanning said light beam across a target to read information therefrom;
   a photo electric converter for receiving light from a target and producing electrical signals which are responsive to received light; and
   a circuit means for setting a first trigger threshold at a predetermined proportion of the peak of said electrical signals and a second trigger threshold at a predetermined minimum level of said electrical signals comprising:
      a detector means for determining said signal peak; and
      a trigger means for switching an output to a first state when said signal level reaches said first trigger threshold and to a second state when said signal level falls to said second trigger threshold.

14. An optical system according to claim 13 wherein, said system is adapted for use in a bar code scanner.

15. An optical system according to claim 1 wherein, said optic means includes a surface for effecting a continuum of focal zones.

16. An optical system according to claim 1 wherein, said optic means comprises a holographic optical element.

17. An optical system according to claim 1 wherein, said optic means is a reflective optic means.

18. An optical system according to claim 17 wherein, said optic means produces a plurality of light source points by multiple reflections therein.

19. An optical system according to claim 1 which further includes;
   a scanning means for scanning said light beam across a target to read information therefrom;
   a photo electric converter for receiving light from a target and producing electrical signals which are responsive to received light; and
   a circuit means for controlling the light output of said light producing means in response to the peak level of said received electrical signals comprising:
      a detector means for determining said peak signal level; and
      a feed back control means for adjustably varying the light output of said light producing means.

20. An optical system according to claim 19 wherein, said system is adapted for use in a bar code scanner.

21. An optical system according to claim 1, wherein said first and second different optical path regions have different indexes of refraction.

22. An optical system according to claim 1, wherein said source position of said light source corresponds to said first source point.

23. An electro-optical system for distinguishing features of a target in a working distance range comprising:

a light source for projecting a light beam on a target to be read;

a photo electric converter for receiving light from said target and producing electrical signals which are responsive to received light; and an adaptive circuit means for setting a first trigger threshold at a predetermined proportion of the peak of said electrical signals and a second trigger threshold at a predetermined minimum level of said electrical signals comprising:

a detector means for determining said signal peak; and a trigger means for switching an output to a first state when said signal level reaches said first trigger threshold and to a second state when said signal level falls to said second trigger threshold.

24. An electro-optic system according to claim 23 wherein said electrical signals are differentiated signals.

25. An electro-optic system according to claim 24 wherein, said trigger means includes a pseudo-power supply voltage level wherein said voltage level is proportionally related to a peak level of said signal level.

26. An electro-optic system according to claim 25 wherein said trigger means is a CMOS trigger means.

27. An electro-optic system for distinguishing features of a target in a working distance range comprising:

a light source for producing a light beam;

a scanning means for scanning said light beam across a target to read information therefrom;

a photo electric converter for receiving light from a target and producing electrical signals which are responsive to received light;

a circuit means for controlling the light output of said light producing means in response to the peak level of said received electrical signals comprising:

a detector means for determining the peak level of said signals; and a feed back control means for adjustably varying the light output of said light producing means.

28. An electro-optic system according to claim 27 wherein said light output is relatively less for close in targets and more for far out targets.

29. An electro-optical system according to claim 27 wherein, said system is adapted for use in a bar code scanner.

30. An optical system for distinguishing features of a target in a working distance range comprising:

a light producing means for generating a light beam from a light source at a source position;

a focus means for converging said light beam in said working distance range; and a transparent optic means having first and second different optical path regions for simultaneously receiving light from said source, said first and second optical path regions of said transparent optic means being disposed proximate said focus means;

wherein said first optical path region effects at least one focal range in said working distance range and wherein said second optical path region of said transparent optic means is formed of a translucent means for scattering an unwanted portion of said light beam.

31. The optical system of claim 30, wherein said first optical path region is formed of an opening in said transparent optic means.

32. A method for distinguishing features of a target in a working distance range comprising the steps:

(A) generating a first group of light rays and a second group of light rays from a light source at a source position;

(B) simultaneously receiving said first group of light rays and said second group of light rays, respectively, from said source position with at least first and second different optical path regions of optic means between said source and a focus means, and refractively forming, with said at least first and second different optical path regions, respectively, a third group of light rays and a fourth group of light rays; and (C) converging, with said focus means, said third group of light rays in a first end of said working distance range and said fourth group of light rays in a second end of said working distance range, said second end of said working distance range being downrange from said first end of said working distance range;

wherein said optic means has a thickness that is less than a length between said first and second ends of said working distance range, and said first optical path region is formed of an opening in said optic means.

33. A method according to claim 32 wherein, said second optical path region of said optic means consists of a refractive material with an index of refraction greater than one.

34. A method according to claim 33 wherein, said optic means has at least one step.

35. A method according to claim 34 wherein, said focus means and said optic means are integrally combined as a single element.

36. A method according to claim 33 wherein, said optic means is generally flat with at least one opening.

37. A method according to claim 36 wherein, said opening is a circular opening.

38. A method according to claim 37 wherein, step (c) further comprises converging a first portion of the light beam in a first focal range and a second portion of the light beam in a second focal range farther down range than said first focal range.

39. A method according to claim 36 wherein, said opening is generally slot shaped.

40. A method according to claim 36 wherein, said optic means includes a bar shaped area for light to pass through.

41. A method according to claim 32 wherein, step (c) further comprises apportioning a relatively smaller amount of light to a close-in working distance range and a relatively larger amount of light to a far-out working distance range.

42. A method according to claim 32, further comprising the steps of:

(D) scanning said light beam across a target to read information therefrom;

(E) receiving light from said target and producing electrical signals which are responsive to received light; and (F) setting a first trigger threshold at a predetermined proportion of the peak of said electrical signals and a second trigger threshold at a predetermined minimum level of said electrical signals.

43. A method according to claim 32 wherein, said optic means effects a continuum of focal zones.

44. A method according to claim 32 wherein, said optic means comprises a holographic optical element.

45. A method according to claim 32 wherein, said optic means is a reflective optic means.

46. A method according to claim 45 wherein, said optic means effects a plurality of light source points by multiple reflections therein.

47. A method according to claim 32, further comprising the steps of:
- (D) scanning said light beam across a target to read information therefrom;
- (E) receiving light from said target and producing electrical signals which are responsive to received light; and
- (F) controlling, with a circuit means, a light output of a light producing means in response to a peak level of said electrical signals, wherein said circuit means is formed of a detector means for determining said peak signal level and a feed back control means for adjustably varying the light output of said light producing means.

48. A method according to claim 32, wherein said first and second different optical path regions have different indexes of refraction.

49. A method according to claim 32, wherein said source position of said light source corresponds to said first source point.

50. A method for distinguishing features of a target in a working distance range comprising the steps of:
- (A) generating a light beam from a light source at a source position;
- (B) simultaneously receiving light from said source position with at least first and second different optical path regions of a transparent optic means disposed proximate a focus means;
- (C) converging, with said focus means, said light beam in said working distance range;
- (D) effecting, with said first optical path region of said transparent optic means, at least one focal range in said working distance range; and
- (E) scattering, with said second optical path region of said transparent optic means, an unwanted portion of said light beam.

* * * * *